United States Patent
Berger et al.

(10) Patent No.: US 6,430,565 B1
(45) Date of Patent: Aug. 6, 2002

(54) PATH COMPRESSION FOR RECORDS OF MULTIDIMENSIONAL DATABASE

(75) Inventors: Alexander Berger, Redmond; Amir Netz; Mosha Pasumansky, both of Bellevue, all of WA (US)

(73) Assignee: Microsoft Corporation, Redmond, WA (US)

(*) Notice: Subject to any disclaimer, the term of this patent is extended or adjusted under 35 U.S.C. 154(b) by 200 days.

(21) Appl. No.: 09/602,599

(22) Filed: Jun. 22, 2000

Related U.S. Application Data

(60) Provisional application No. 60/140,432, filed on Jun. 22, 1999.

(51) Int. Cl.⁷ .............................................. G06F 17/30
(52) U.S. Cl. ........................ 707/101; 707/101; 707/201
(58) Field of Search ................................ 707/203, 202, 707/201, 5, 6, 2, 102, 101; 341/87; 712/20, 222, 203, 13, 10, 23

(56) References Cited

U.S. PATENT DOCUMENTS

| | | | |
|---|---|---|---|
| 5,832,475 A | * 11/1998 | Agrawal et al. | 707/2 |
| 5,873,097 A | * 2/1999 | Harris et al. | 707/203 |
| 5,926,820 A | * 7/1999 | Agrawal et al. | 707/200 |
| 6,094,651 A | * 7/2000 | Agrawal et al. | 707/5 |
| 6,108,647 A | * 8/2000 | Poosala et al. | 707/1 |

* cited by examiner

*Primary Examiner*—Diane D. Mizrahi
(74) *Attorney, Agent, or Firm*—Merchant & Gould; Timothy P. Sullivan

(57) ABSTRACT

Compressing system paths in a database is disclosed. The systems and methods of the invention define an efficient mechanism to specify a cell's location within the database where there are hierarchies of levels within a dimension. The compressed system paths allow random access of the data without decompressing the data. The format used lends itself well to indexing, and also to creating aggregations of the cell data.

21 Claims, 10 Drawing Sheets

US 6,430,565 B1

PATH COMPRESSION FOR RECORDS OF MULTIDIMENSIONAL DATABASE

RELATED APPLICATIONS

This application claims the benefit under 35 U.S.C. §119 (e) of U.S. Provisional Application, Serial No. 60/140,432 filed on Jun. 22, 1999.

FIELD OF THE INVENTION

The present invention pertains generally to computer-implemented databases, and more particularly to storing records in such databases.

BACKGROUND OF THE INVENTION

Online analytical processing (OLAP) is an integral part of most data warehouse and business analysis systems. OLAP services provide for fast analysis of multidimensional information. For this purpose, OLAP services provide for multidimensional access and navigation of the data in an intuitive and natural way, providing a global view of data that can be "drilled down" into particular data of interest. Speed and response time are important attributes of OLAP services that allow users to browse and analyze data online in an efficient manner. Further, OLAP services typically provide analytical tools to rank, aggregate, and calculate lead and lag indicators for the data under analysis.

In OLAP, information is viewed conceptually as cubes, consisting of dimensions, levels, and measures. In this context, a dimension is a structural attribute of a cube that is a list of members of a similar type in the user's perception of the data. Typically, there are hierarchy levels associated with each dimension. For example, a time dimension may have hierarchical levels consisting of days, weeks, months, and years, while a geography dimension may have levels of cities, states/provinces, and countries. Dimension members act as indices for identifying a particular cell or range of cells within a multidimensional array. Each cell contains a value, also referred to as a measure, or measurement.

One issue regarding the design of multidimensional databases is how to represent the cells in the multidimensional space. One potential design choice is to represent the multidimensional space as an array of cells, with the size of the array determined by the multiplication of the number of points in each dimension. A significant problem with this approach is that the size of the database grows exponentially as the number and size of the dimensions increase. This leads to a rapid depletion of the physical resources such as persistent storage and RAM required to implement the database. This phenomenon is known as data explosion for multidimensional databases.

Additionally, space is wasted in the above-mentioned approach, as data in multidimensional databases tends to be sparse. That is, not every cell is expected to have a value associated with it. For example, consider a Store dimension having a hierarchy of Country, State, and City specifying the location of a store, and a Product dimension having a product identification and a product count measure. No store in the database will be expected to stock every possible product, and in fact any one store may only stock a small percentage of the available products. In this situation, most of the cells in the multidimensional space would contain no data, thus wasting much of the space allocated to the database.

A second issue relates to locating cells in the multidimensional space. It is desirable to be able to locate cells quickly in order to provide acceptable system throughput. Representing the cells as a multidimensional array provides for rapid access to the cells, but has the data explosion problem mentioned above.

A third issue relates to the capability to perform aggregations on the multidimensional data. Databases are commonly queried for aggregations (e.g. summaries, minimums, maximums, counts, etc.) of detail data rather than individual data items. For example, a user might want to know sales data for a given period of time without regard to geographical distinctions. These types of queries are efficiently answered through aggregations. Aggregations are precomputed summaries of selected detail data that allow an OLAP system or a relational database to respond quickly to queries by avoiding collecting and aggregating detailed data during query execution. Without aggregations, the system needs to scan all of the rows containing the detailed data to answer these queries, resulting in potentially substantial processing delays. With aggregations, the system computes and materializes aggregations ahead of time so that when the query is submitted to the system, the appropriate summary already exists and can be sent to the user much more quickly. Calculating these aggregations, however, can be costly, both in terms of processing time and in terms of disk space consumed.

A fourth issue relates to the stability of the members of a dimension hierarchy level. Stability refers to the propensity for members to move from one point in the dimension hierarchy to another. Some types of dimensions are very stable. For example, hierarchies in the time dimension are very stable, as there is no need to move a month from one year to the next.

Other hierarchies, however, tend to be much less stable, and members frequently move from point to point in the dimension hierarchy. As an example, consider a customer dimension having a hierarchy of Country, State, City, Customer, where a customer is located in a particular city of a particular state within a particular country. It is quite likely that at some point in time, a customer will move from one city to another, possibly in a different state, and perhaps to a different country.

In previous systems, the movement of a member from one point in a hierarchy to another point results in the entire OLAP database having to be rebuilt to reflect the new hierarchy. Completely rebuilding the database typically takes a large amount of time and system resources, especially for OLAP databases with large numbers of detail records.

SUMMARY OF THE INVENTION

The present invention is directed at addressing the above-mentioned shortcomings, disadvantages and problems, and will be understood by reading and studying the following specification.

The systems and methods described herein create and maintain cell data records in an OLAP database system. One aspect of the system is that cell data records are created containing a compressed system path. The system path is comprised of one or more compressed dimension paths that define the location of a cell in a multidimensional database. The dimension path may be a flexible or rigid dimension path, compressed or uncompressed. Flexible dimension paths map a unique member id to a rigid dimension path maintained outside of the system path. This allows a member to move from one location to another in the dimension hierarchy without changing the system path, thereby avoiding a rebuild of the OLAP database. Rigid dimension paths map directly to a member of a level in the dimension hierarchy. The format used for the dimension paths provides an efficient mechanism for locating the cell, and in addition, can be indexed easily to allow rapid location of cell data. Another aspect is that after the system paths have been created the system paths are loaded in segments and then compressed in binary format. The bits used to store each particular level member are constant, allowing random access of the data.

A further aspect of the system is that the format of the system path provides an efficient mechanism for creating aggregations. One aspect of the system converts flexible dimension paths that are in the dimension levels to be aggregated to rigid dimension paths before aggregrating. The rigid dimension paths have their corresponding member index set to a null value in the dimension path of each record. The records are then scanned for a match to a system path representing the aggregation. Those that match have their measure data included in the aggregation.

The present invention describes systems, clients, servers, methods, and computer-readable media of varying scope. In addition to the aspects and advantages of the present invention described in this summary, further aspects and advantages of the invention will become apparent by reference to the drawings and by reading the detailed description that follows.

Detailed Description of the Preferred Embodiment

In the following detailed description of exemplary embodiments of the invention, reference is made to the accompanying drawings, which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

The detailed description is divided into four sections. In the first section, a system level overview of an exemplary embodiment of the invention is presented. In the second section, the hardware and the operating environment in conjunction with which embodiments of the invention may be practiced are described. In the third section, an exemplary cube for an OLAP system is described. In the fourth section, methods of an exemplary embodiment of the invention are provided.

System Level Overview

Figure 5:
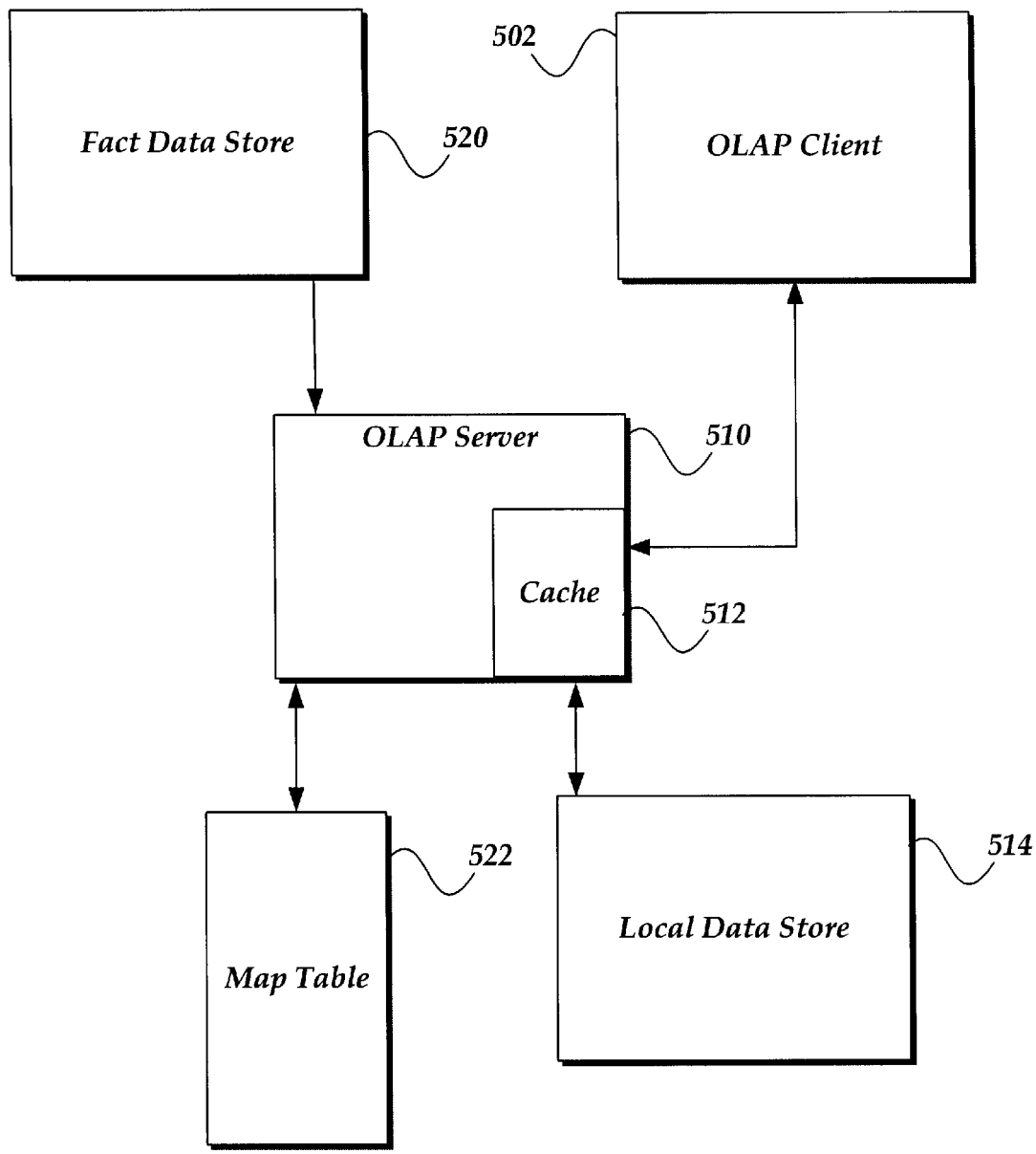
FIG. 5 is a system level overview of various embodiments of the invention.

A system level overview of the operation of an exemplary embodiment of the invention is described by reference to FIG. 5. The concepts of the invention are described as operating in a multiprocessing, multithreaded virtual memory operating environment on a computer, such as computer 20 in FIG. 1. The operating environment includes an OLAP client 502, OLAP server 510, local data store 514, and fact data store 520, all of which operate on the cell records for cubes, including the records and cube described in the previous section.

OLAP client 502 is an application program that requires the services of an OLAP system. OLAP client 502 may be any type of application that interacts with the OLAP system, for example, a data mining application, a data warehousing application, a reporting application, etc. OLAP client 502 typically interacts with OLAP server 510 by issuing OLAP queries. These queries are parsed, as is known in the art, into a request for data from a cell or range of cells, and the request is passed to the OLAP server 510.

OLAP server 510 receives queries and controls the processing of queries. In one embodiment of the invention, the server maintains a local store 514 that contains the cell data used to answer the queries. In an embodiment of the invention, the OLAP server 510 is a version of the SQL Server OLAP product from Microsoft Corporation.

The local data store 514 contains records describing the cells that are present in a multidimensional database, with one record used for each cell that actually has measurement data present (i.e. no records exist for those cells having no measurement data). The general format of these records is described above with reference to FIG. 4. In an embodiment of the invention, local data store 514 is a relational database, such as SQL Server. In this particular embodiment, records are stored in a relational table. This table can be indexed based on the dimensional paths of the record to allow rapid access to cell measurement data contained in the record. The indexing can be performed using hash indexing or AVL tree indexing as is known in the art.

OLAP server 510 populates local data store 514 by reading data from fact data store 520. Fact data store 520 is also a relational database system. In one embodiment of the invention, the system used is the SQL Server Database from Microsoft Corporation. In alternative embodiments of the invention, database systems such as Oracle, Informix or Sybase can be used. The invention is not limited to any particular type of relational database system.

OLAP server 510 reads the fact data (also known as detail data) from fact data store 520 at predetermined times, and converts the fact data into cell data records for populating local data store 514. In an embodiment of the invention, the fact data is read once during a 24 hour period, typically during a time when the fact data store is not busy responding to user queries. In an alternative embodiment of the invention, the fact data is read and converted when a system administrator issues a command to the OLAP server 510 to do so. Updates to the local data store 514 can be incremental, or they can result in a complete refresh of the data. Incremental updates are desirable, because only the data that has changed in fact data store 520 need be converted and added to local data store 514. However, if the structure of the data in either fact data store 520 or local data store 514 changes, then a complete refresh is required. The frequency of updates to the local data store 514 will generally be determined by user requirements as to how current (or accurate) the cell data must be, and the volume of data that must be updated.

OLAP server 510 also maintains a map table 522. The map table 522 is used to maintain mappings from rigid dimensional paths to unique member identifiers. The OLAP server 510 uses map table 522 to determine whether or not a flexible path can be constructed when a new cell record is added to local data store 514.

In an embodiment of the invention, the OLAP server 510 maintains a cache 512 of cell records. In this embodiment, the cache 512 maintains cell data records that have been recently requested, or those cell data records that are frequently requested. Maintaining cell record data in a cache is desirable, because it provides quicker responses to queries that can be satisfied by records appearing in the cache.

Hardware and Operating Environment

Figure 1:
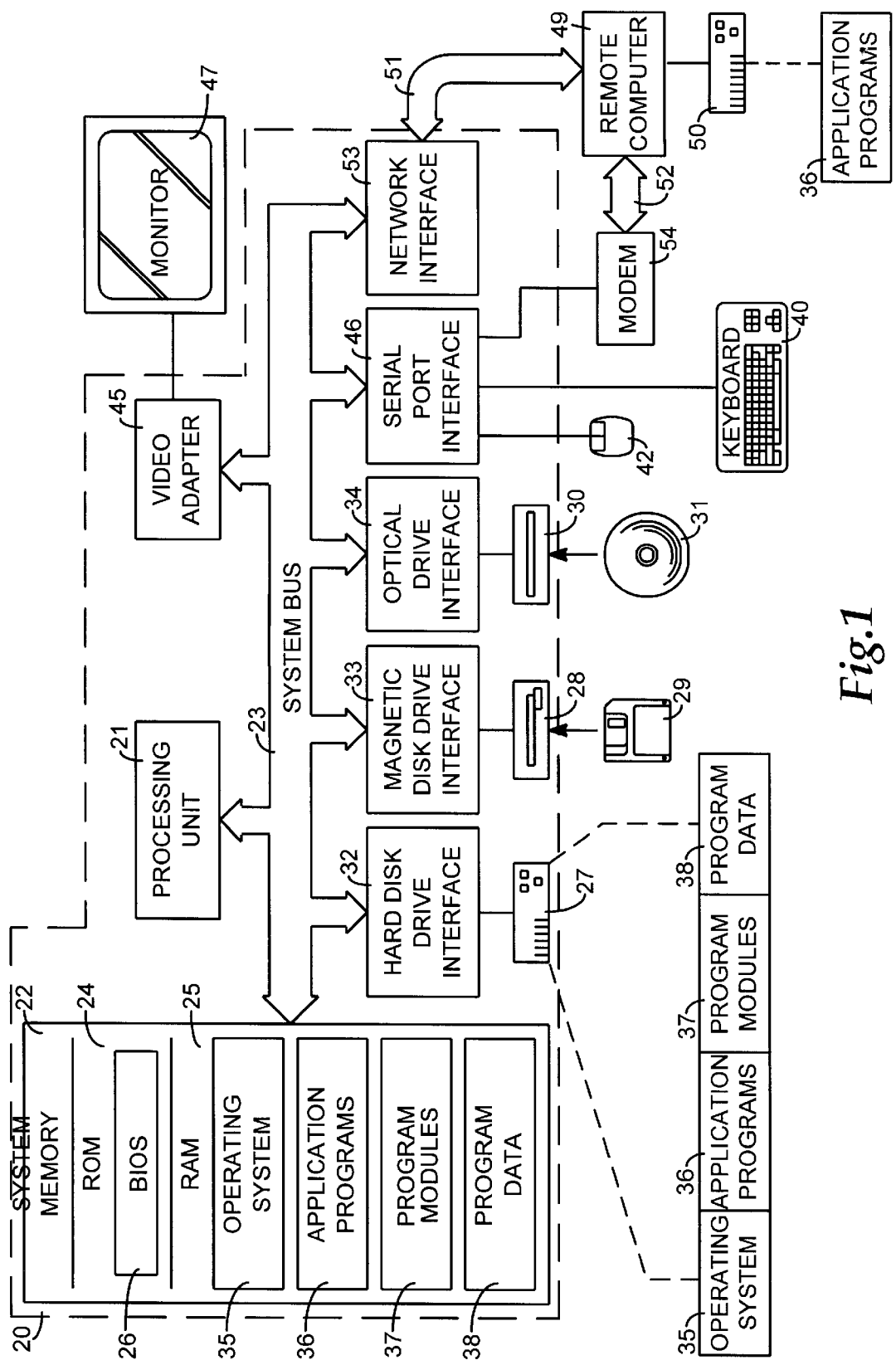
FIG. 1 is a diagram illustrating a hardware and operating environment in conjunction with which embodiments of the invention may be practiced.

FIG. 1 is a diagram of the hardware and operating environment in conjunction with which embodiments of the invention may be practiced. The description of FIG. 1 is intended to provide a brief, general description of suitable computer hardware and a suitable computing environment in conjunction with which the invention may be implemented. Although not required, the invention is described in the general context of computer-executable instructions, such as program modules, being executed by a computer, such as a personal computer. Generally, program modules include routines, programs, objects, components, data structures, etc., that perform particular tasks or implement particular abstract data types.

Moreover, those skilled in the art will appreciate that the invention may be practiced with other computer system configurations, including hand-held devices, multiprocessor systems, microprocessor-based or programmable consumer electronics, network PCS, minicomputers, mainframe computers, and the like. The invention may also be practiced in distributed computing environments where tasks are performed by remote processing devices that are linked through a communications network. In a distributed computing environment, program modules may be located in both local and remote memory storage devices.

The exemplary hardware and operating environment of FIG. 1 for implementing the invention includes a general purpose computing device in the form of a computer 20, including a processing unit 21, a system memory 22, and a system bus 23 that operatively couples various system components including the system memory to the processing unit 21. There may be only one or there may be more than one processing unit 21, such that the processor of computer 20 comprises a single central-processing unit (CPU), or a plurality of processing units, commonly referred to as a parallel processing environment. The computer 20 may be a conventional computer, a distributed computer, or any other type of computer; the invention is not so limited.

The system bus 23 may be any of several types of bus structures including a memory bus or memory controller, a peripheral bus, and a local bus using any of a variety of bus architectures. The system memory may also be referred to as simply the memory, and includes read only memory (ROM) 24 and random access memory (RAM) 25. A basic input/output system (BIOS) 26, containing the basic routines that help to transfer information between elements within the computer 20, such as during start-up, is stored in ROM 24. The computer 20 further includes a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD ROM or other optical media.

The hard disk drive 27, magnetic disk drive 28, and optical disk drive 30 are connected to the system bus 23 by a hard disk drive interface 32, a magnetic disk drive interface 33, and an optical disk drive interface 34, respectively. The drives and their associated computer-readable media provide nonvolatile storage of computer-readable instructions, data structures, program modules and other data for the computer 20. It should be appreciated by those skilled in the art that any type of computer-readable media which can store data that is accessible by a computer, such as magnetic cassettes, flash memory cards, digital video disks, Bernoulli cartridges, random access memories (RAMs), read only memories (ROMs), and the like, may be used in the exemplary operating environment.

A number of program modules may be stored on the hard disk, magnetic disk 29, optical disk 31, ROM 24, or RAM 25, including an operating system 35, one or more application programs 36, other program modules 37, and program data 38. A user may enter commands and information into the personal computer 20 through input devices such as a keyboard 40 and pointing device 42. Other input devices (not shown) may include a microphone, joystick, game pad, satellite dish, scanner, or the like. These and other input devices are often connected to the processing unit 21 through a serial port interface 46 that is coupled to the system bus, but may be connected by other interfaces, such as a parallel port, game port, or a universal serial bus (USB). A monitor 47 or other type of display device is also connected to the system bus 23 via an interface, such as a video adapter 48. In addition to the monitor, computers typically include other peripheral output devices (not shown), such as speakers and printers.

The computer 20 may operate in a networked environment using logical connections to one or more remote computers, such as remote computer 49. These logical connections are achieved by a communication device coupled to or a part of the computer 20; the invention is not limited to a particular type of communications device. The remote computer 49 may be another computer, a server, a router, a network PC, a client, a peer device or other common network node, and typically includes many or all of the elements described above relative to the computer 20, although only a memory storage device 50 has been illustrated in FIG. 1. The logical connections depicted in FIG. 1 include a local-area network (LAN) 51 and a wide-area network (WAN) 52. Such networking environments are commonplace in offices, enterprise-wide computer networks, intranets and the Internet.

When used in a LAN-networking environment, the computer 20 is connected to the local network 51 through a network interface or adapter 53, which is one type of communications device. When used in a WAN-networking environment, the computer 20 typically includes a modem 54, a type of communications device, or any other type of communications device for establishing communications over the wide area network 52, such as the Internet. The modem 54, which may be internal or external, is connected to the system bus 23 via the serial port interface 46. In a networked environment, program modules depicted relative to the personal computer 20, or portions thereof, may be stored in the remote memory storage device. It is appreciated that the network connections shown are exemplary and other means of and communications devices for establishing a communications link between the computers may be used.

The hardware and operating environment in conjunction with which embodiments of the invention may be practiced has been described. The computer in conjunction with which embodiments of the invention may be practiced may be a conventional computer, a distributed computer, or any other type of computer; the invention is not so limited. Such a computer typically includes one or more processing units as its processor, and a computer-readable medium such as a memory. The computer may also include a communications device such as a network adapter or a modem, so that it is able to communicatively couple other computers.

Exemplary Cube and Dimension

Figure 2:
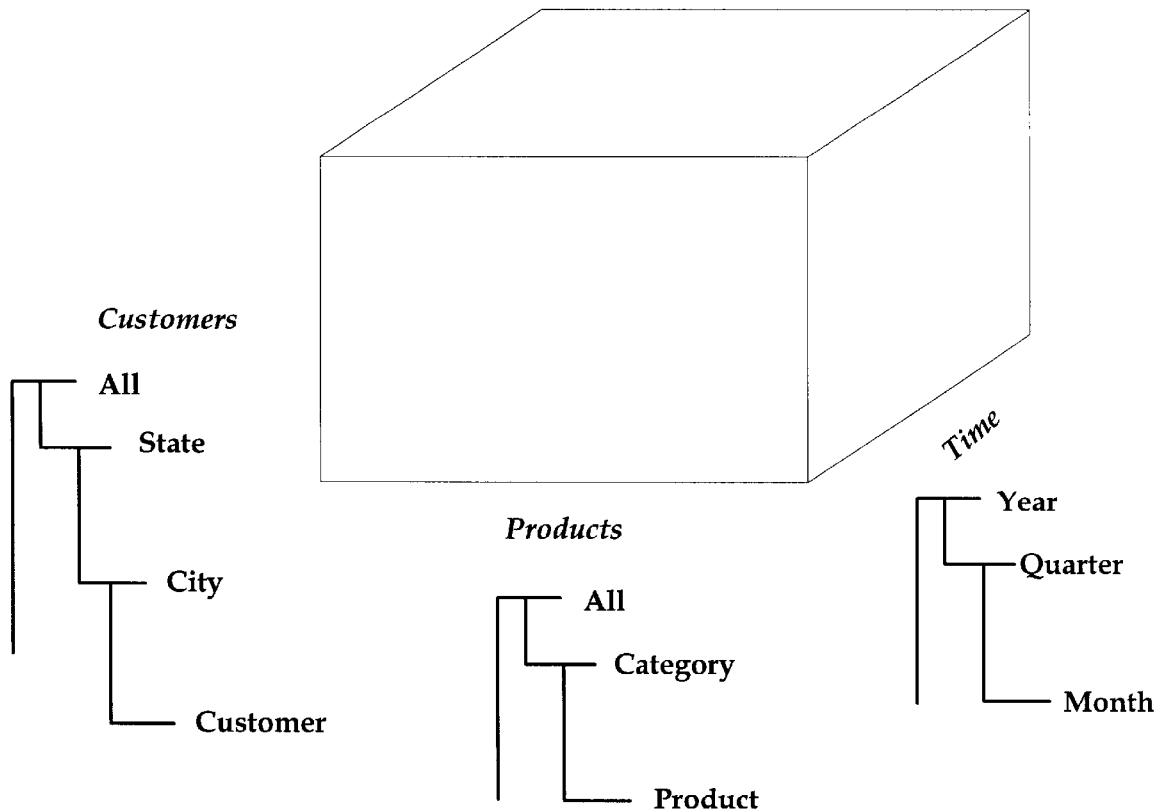
FIG. 2 is a diagram illustrating an exemplary OLAP cube having three dimensions.

In the detailed description that follows, reference will be made to a small, three-dimensional OLAP cube as shown in FIG. 2. This exemplary OLAP cube has three dimensions. The first dimension, the Customers dimension, has four hierarchical levels (All, State, City, and Customer). The second dimension, the Products dimension, has three levels (All, Category and Product). Finally, the third dimension, the Time dimension has three levels (Year, Quarter, and Month). Additionally, the cube has two measures, Purchases and Units (not shown). This cube is presented to provide a reference example of how the systems and methods of the invention operate. It will be appreciated that the OLAP cubes maintained by various embodiments of the invention may have more or fewer dimensions than in this example, and that the OLAP cube may have more or fewer hierarchy levels than in this exemplary example.

Figure 3A:
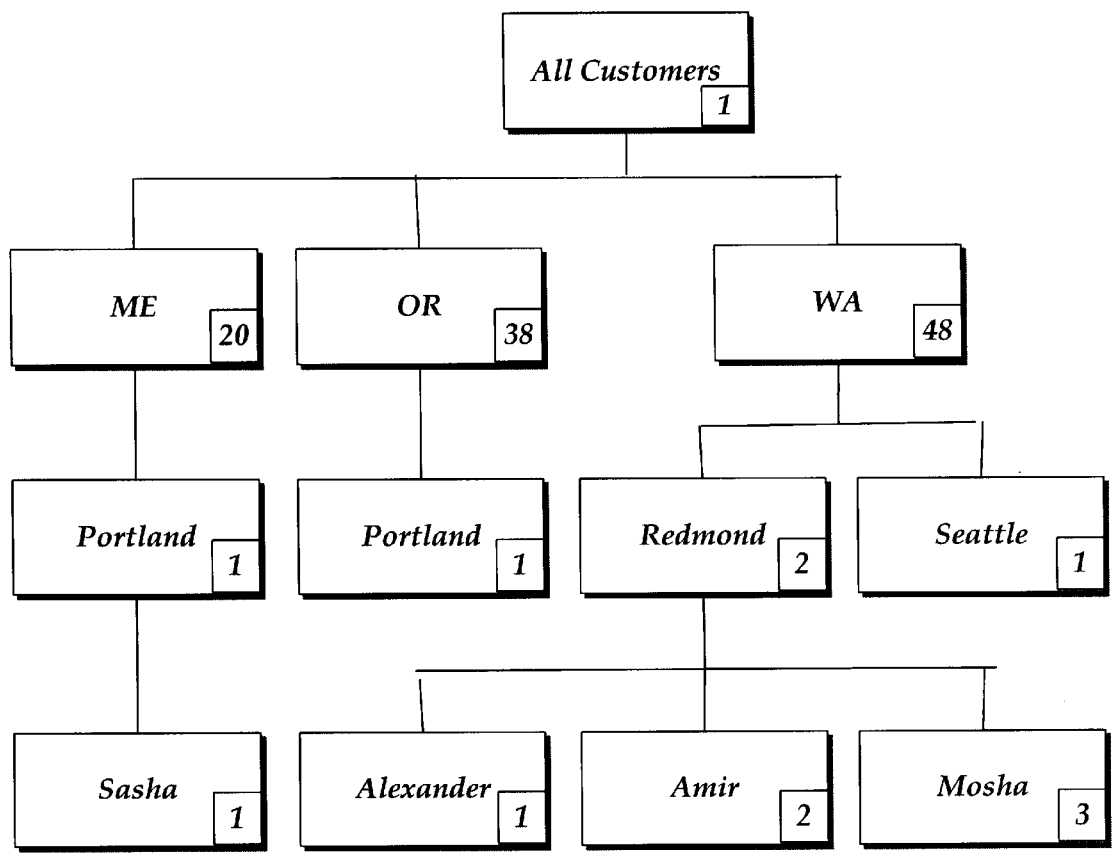
FIGS. 3A–3C are diagrams illustrating an exemplary dimension hierarchy within a multidimensional database.
Figure 3B:
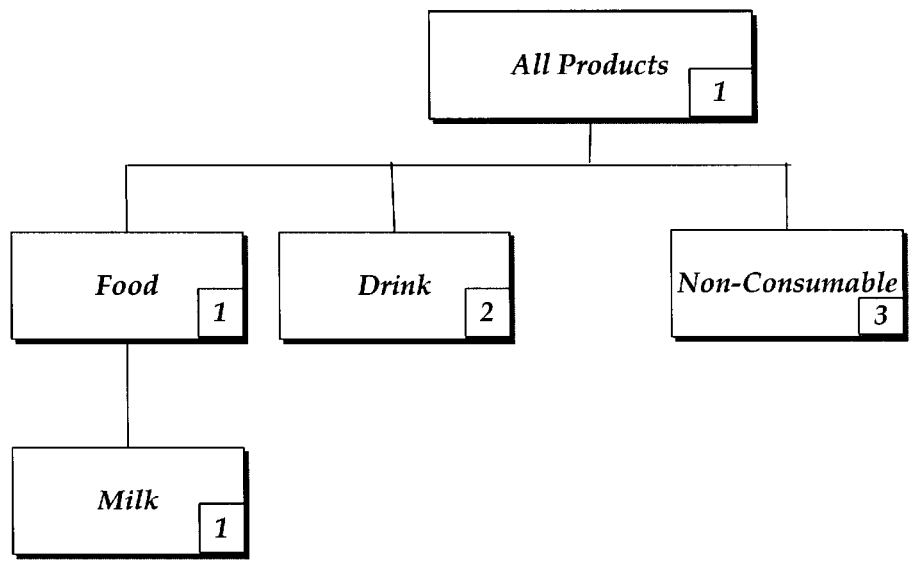
Figure 3C:
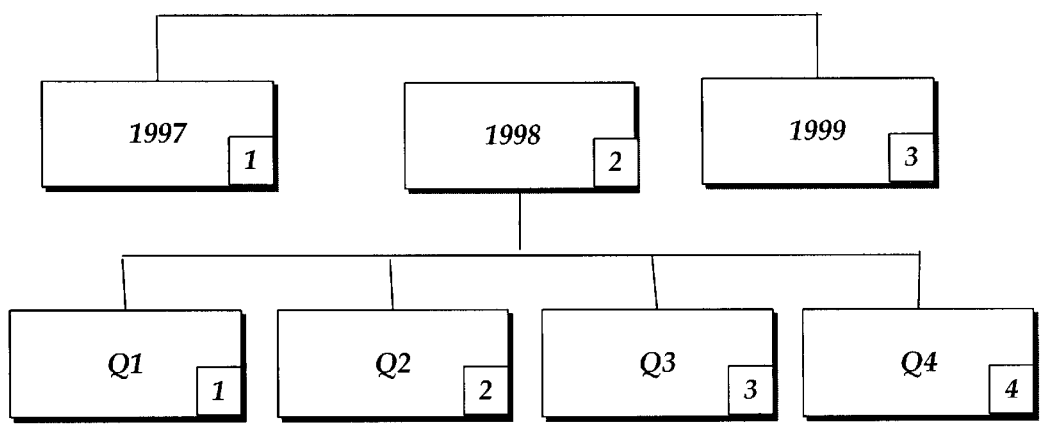

Graphical representations of the dimensions in the above-described exemplary cube are presented in FIGS. 3A–3C. A dimension is represented as a tree, referred to as a dimension tree. Leaf nodes in the tree correspond to the most detailed data in the dimension, while the inner branch nodes correspond to more aggregated data. The closer the node is to the root node, the more aggregated the data, with the root node representing the most aggregated, least detailed data in the dimension.

The Customer dimension is represented in FIG. 3A. In this exemplary representation, the State level has three members: Maine (Me.), Oregon (Oreg.) and Washington (Wash.). The Cities level has four members: Portland (Me.), Portland (Oreg.), Redmond (Wash.) and Seattle (Wash.). It should be noted although a member labeled Portland appears twice, each member is considered a distinct reference because the city appears under a different State member in the hierarchy. The Customer level has four members: Sasha, Alexander, Amir, and Mosha.

The Products dimension is represented in FIG. 3B. In the exemplary representation, the Category level has three members: Food, Drink, and Non-Consumable. The Product level has one member, Milk.

The Time dimension is represented in FIG. 3C. In the exemplary representation, the Year level has three members: 1997, 1998, and 1999. The Quarter level has four members: Q1–Q4. The Month level has no members, indicating that no monthly data is available. In this case, the most detailed data available is at the Quarter level.

Each data cell in a multidimensional database is uniquely identified by specifying a coordinate on each dimension. In one embodiment of the invention, a cell is identified by specifying a dimension path for each dimension in a cube in the multidimensional database. The collection of dimension paths comprising the coordinates for the cell are concatenated and stored in an array referred to as the system path. In an embodiment of the invention, the order of dimension paths in the system path is dependent on the internal order of the dimensions in the cube, as determined by the metadata defining the cube. However, the invention is not limited to a particular ordering scheme and other ordering schemes are possible and within the scope of the invention. For example, the order of dimension paths could be determined alphabetically by the name of the dimension.

In order to uniquely identify a particular member, each of the members from the root node to the leaf node for the member is specified. For example, in an embodiment of the invention, in order to refer to the customer Amir in the Customers dimension shown in FIG. 3A the following sequence of members is specified: {All Customers}. {WA}. {Redmond}. {Amir}. Similarly, to refer to Quarter 2 in the Time dimension shown in FIG. 3C, the members specified are: {1998}. {Q2}.

Those of ordinary skill in the art will appreciate that the members shown in FIGS. 3A–3C represent an exemplary cube and that no embodiment of the invention is limited to a particular number or type of dimensions or dimension members.

In the above example, strings representing member names are used to designate a particular member of a dimension. Alternatively, the strings are replaced with representative members numbers. When represented by numbers, a path from the root node to a branch node is represented by a member number at each level of the dimension that is traversed to reach the leaf node. The number assigned to each member is unique among the members having a common parent. In other words, a unique number is assigned to each of the siblings of a parent. In one embodiment, the root node is assigned the number 1 while branch and leaf nodes are assigned a number representing their order among their siblings. The invention, however, is not limited to any particular numbering scheme for the node. It is sufficient that the number is unique among the nodes having a common parent.

Thus, each member in a dimension is represented by an array of numbers defining the path to the member. This array is the dimension path. The number of elements in the array is the number of levels in the dimension, and the position in the array reflects the hierarchy of levels. For example, referring to FIG. 3A, the dimension path for member Amir in the Customers dimension is {1-48-2-2}. This represents the path comprising the root node All Customers (1), the WA member at the state level (WA is the $48^{th}$ state alphabetically), the Redmond member at the city level (Redmond is the second city at that level under WA), and the member Amir at the customer level (Amir is the second customer under Redmond). In one embodiment, a number in the array represents each level. If the member is not at a leaf node, the number 0 is used in one embodiment of the invention to represent the positions for the levels below the member. Thus, the dimension path array for the member Portland, Oreg. in the Customer dimension is {1-38-1-0}.

Not all dimensions have a single root member. For example, consider the Time dimension of the exemplary cube. There is no single "all time" member at the top-most level in this dimension, rather the Time dimension contains three members, each specifying a particular year. In this case, one embodiment of the invention assigns an index number to each members in the top-most level based on a natural order of the members. This natural order can be based on a numeric order, an alphabetic order, or the temporal order in which the members were created. For instance, in FIG. 3C, the dimension path for Q3 in the year 1998 is {2-3-0} (1998 is the second year at the top-most level, Q3 is the third member under 1998, and there are no month members).

The dimension paths described above are referred to as rigid dimension paths, because they do not allow a cell to change its position within the dimension hierarchy without having to rebuild the database. This is because the indexing scheme used directly maps to a particular point in the hierarchy, and cannot map to any other point without changing at least one of the index components.

Flexible dimension paths offer an alternative to rigid dimension paths. Flexible dimension paths allow a cell to change its position in the hierarchy without affecting the stored path. In order to implement flexible paths, a system maintains a mapping from a rigid dimensional path to an identifier associated with a cell member. For example, the table below illustrates a mapping for the Customer dimension members provided above.

TABLE 1

| Customer | Id | Rigid Dimension Path |
|---|---|---|
| Alexander | &14 | {1-48-2-1} |
| Amir | &15 | {1-48-2-2} |
| Mosha | &16 | {1-48-2-3} |
| Sasha | &17 | {1-20-1-1} |

To illustrate the system path described above, consider the cell associated with the customer Amir for All Products in Quarter 4 of 1998. The string representation for the cell path is: ({Customers}. {All_Customers}. {WA}. {Redmond}. {Amir}, {Products}. {All Products}, {Time}. {1998}. {Q4}). The corresponding system path using numbered rigid dimensional paths is: {1-48-2-2}-{1-0-0}-{2-4-0}. The same system path can be represented using a flexible dimension path as {&15}-{1-0-0}-{2-4-0}. In this case, when the cell is accessed, the accessor consults a mapping table to determine the correct cell location for the dimension represented by the flexible portion of the path. In the example above, only one dimension has a flexible path. The invention is not so limited, however, and the number of flexible paths appearing in a system path is not fixed to any particular number. It is desirable to differentiate the flexible path from a rigid path containing only one level, thus a flexible path is introduced by a distinguishing character. In one embodiment of the invention, the distinguishing character is the "&", however the invention is not limited to any particular distinguishing character or set of characters. Now assume that Amir moves from Redmond to Seattle. In this case, the rigid dimensional path changes from {1-48-2-2} to {1-48-1-1}. However, the flexible dimension path remains the same (& 15). Thus, as can be seen from the above example, the database does not need to be rebuilt when a member moves from one point in the hierarchy to another, because the system path to the cell does not change. The change is to the mapping in a map table, not the path in a local store.

In another embodiment of the invention, the numbered rigid dimensional path and flexible dimension path are compressed. As integers typically consist of four (4) bytes, with each byte consisting of eight (8) bits, system paths typically do not require all 32 bits to accurately represent the level number. In one embodiment, each number in the system path at a particular level is represented by the least number of bits to store the largest number at that particular level found within the group of system paths being compressed. For example, if the largest member number at a particular level within a group of system paths is ten (10) then only four (4) bits are used to store the member in compressed binary format. Similarly, member number values up to fifteen (15) may be stored using only four bits. The number of bits used to store each level in the system path is placed in a header that is accessed by the accessor before accessing the paths. In one embodiment of the invention, the number of bits used to store a member number for a particular dimension level are constant, allowing quick access to the member numbers. Table 2 is an example illustrating a mapping for the Customer dimension members provided above.

TABLE 2

| Customer | Rigid Dimension Path (Four Integers) | Flexible Path (One Character + One Integer) | Compressed Rigid Path (Each number represents one bit) | Compressed Flexible Path (5 bits) |
|---|---|---|---|---|
| Alexander | {1-48-2-1} (Four Integers) | {&14} | {1} {110000} {10} {01} | {01110} |
| Amir | {1-48-2-2} | {&15} | {1} {110000} {10} {10} | {01111} |
| Mosha | {1-48-2-3} | {&16} | {1} {110000} {10} {11} | {10000} |
| Sasha | {1-20-1-1} | {&17} | {1} {10100} {01} {01} | {10001} |

As can be seen by referring to Table 2, flexible paths generally use less space than rigid dimension paths but do not offer as great as compression as compressed rigid or compressed flexible paths. While the compression scheme utilized in one embodiment of the invention is binary compression, the invention, is not limited to any particular compression scheme. It is sufficient that the compression scheme stores the system path utilizing less computer space than when not compressed. Additionally, while it is preferable to store the path levels in a constant amount of space to aid in the ability to randomly access the data, this is not a requirement.

Figure 4:
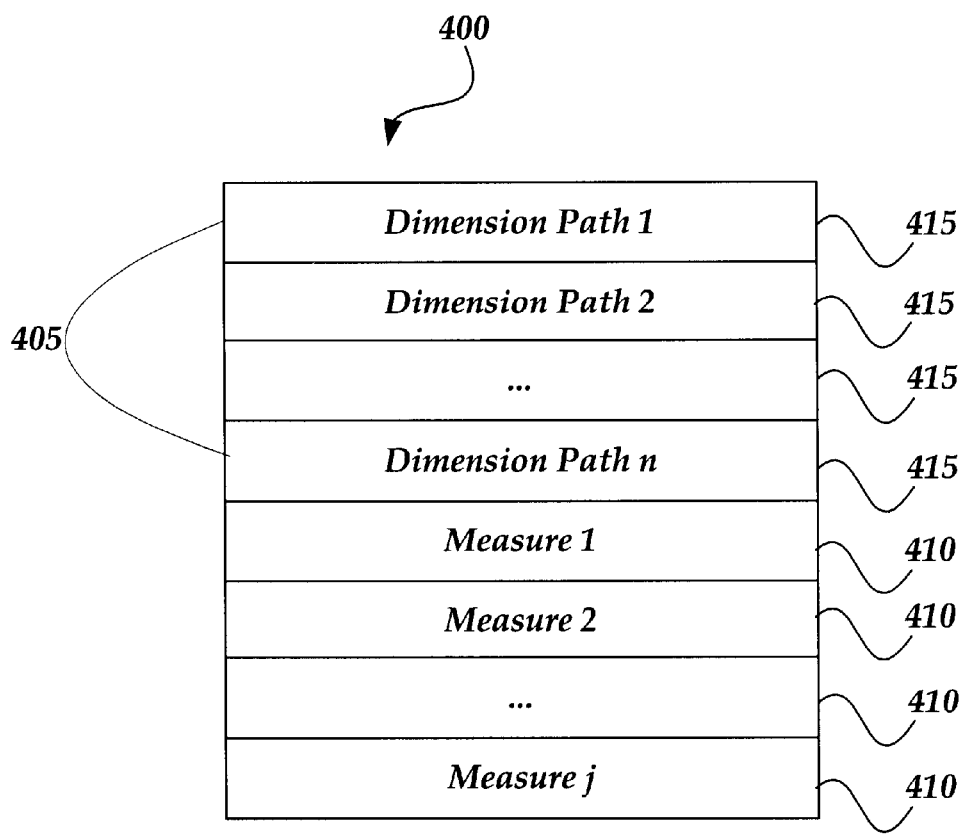
FIG. 4 is a diagram illustrating a record structure for a cell data record according to an embodiment of the invention.

In addition to a system path, each cell in a multidimensional database has one or more measures associated with it. In the exemplary cube, two measures are defined, Purchases and Units, where Purchases is the dollar amount of a particular purchase, and Units is the number of units purchased. FIG. 4 illustrates a data structure for a cell record 400 according to one embodiment of the invention. Cell record 400 contains a system path 405 and one or more measures 410. As described above, system path 405 comprises one or more dimension paths 415. The dimension paths can be either flexible dimension paths or rigid dimension paths, compressed or uncompressed. The order of measures 410 in record 400 may be determined by the order of the measures in the metadata defining the cube, the temporal order in which the measure were defined, or an alphabetic order. The invention is not limited to any particular ordering mechanism.

This section of the detailed description has described a representation of cells in a multidimensional database, and a data structure for storing a cell record. In the sections that follow, systems and methods for creating and manipulating the cell data will be described.

Operations in an Exemplary Embodiment of the Invention

In the first section, a system level overview of the operation of an exemplary embodiment of the invention was described. In this section, the particular operations of the invention performed by an operating environment executing an exemplary embodiment are described by reference to a series of flowcharts shown in FIGS. 6–9. The operations to be performed by the operating environment constitute computer programs made up of program modules and computer-executable instructions or logic circuits and hardwired logic modules. Describing the operations by reference to a flowchart enables one skilled in the art to develop such programs or circuits including such instructions to carry out the operations on suitable computers (the processor of the computer executing the instructions from computer-readable media). The operations illustrated in FIGS. 6–9 are inclusive of the acts to be taken by an operating environment executing an exemplary embodiment of the invention.

Figure 6:
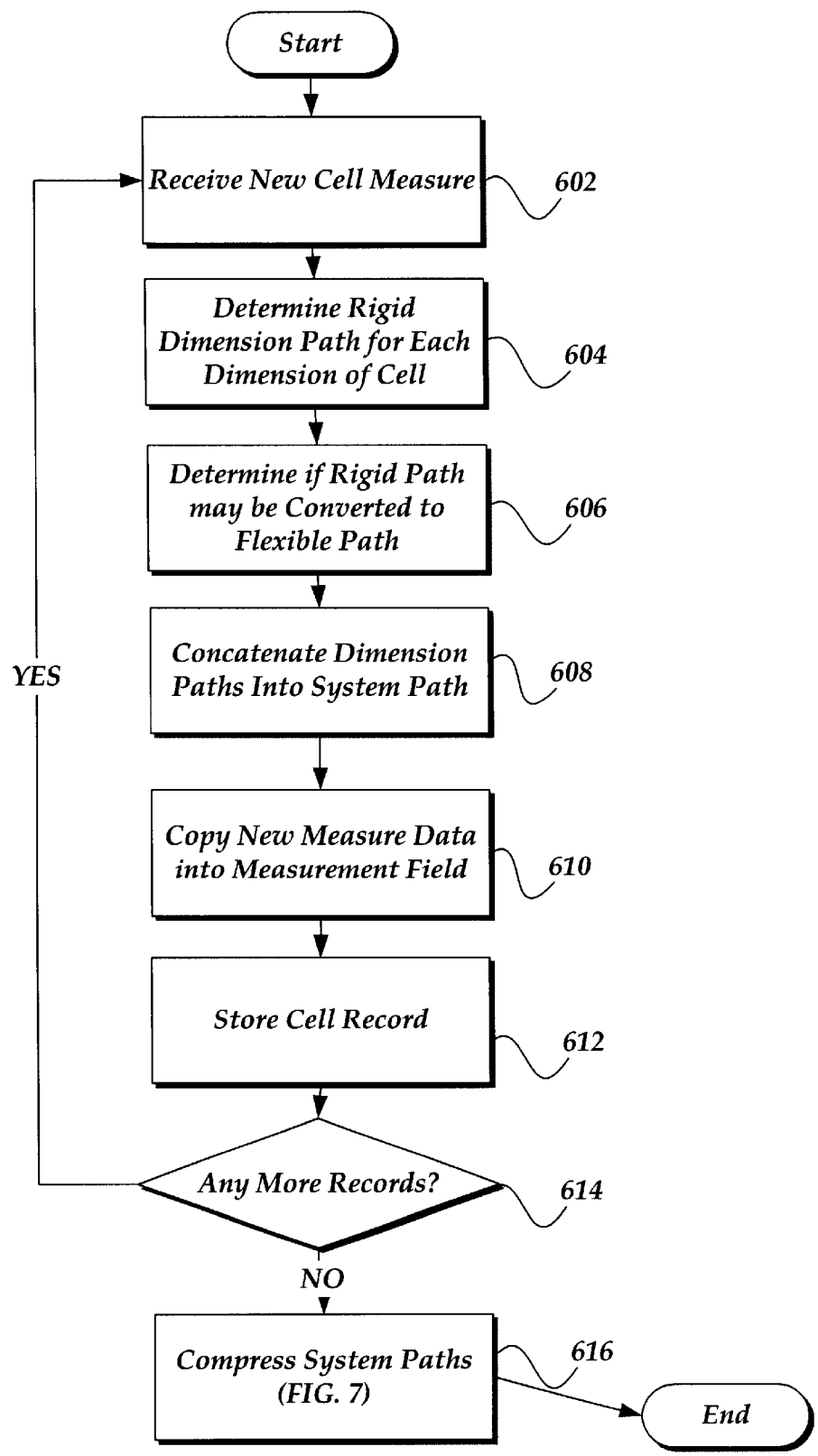
FIG. 6 is a flowchart illustrating a process for creating a system path in an embodiment of the invention.

An operational flow for creating a system path is illustrated in FIG. 6. The operations begins when a program executing the method, such as OLAP server 510, discovers that a new cell is required, and receiving operation 602 receives a value to be used for the measure of the new cell. Typically the new cell will be required because OLAP Server 510 has discovered that a new row has been added to a detail table in a fact data store 520 (FIG. 5) since the last update of the local data store 514.

Next, rigid dimension operation 604 determines the rigid dimension path for each dimension in the cube to which the cell belongs. As discussed above, cells are located by specifying members in each dimension of the OLAP cube. The members reside at a particular level of a dimension tree formed by the levels of the dimension and the members at each level. In an embodiment of the invention, the dimension path is an array of ordinal numbers, one for each level in the dimension. The position of each ordinal number in the array is determined by the position of the level in the dimension hierarchy. The ordinal number at a position is determined by an ordering of the members at the particular level represented by the position that have a common parent. In one embodiment of the invention, if the new cell is not a leaf node, then a value of 0 is used in the dimension path to represent each of the levels below the new cell.

In another embodiment of the invention, the operation checks map table 522 (FIG. 5) to determine if any of the rigid dimensional paths created by rigid dimension operation 604 can be converted into a flexible dimensional path by flexible dimension operation 606. If any mappings exist that match a rigid dimensional path, the rigid dimensional path is replaced with the unique member id that becomes the flexible path. A distinguishing character is included to indicate that the dimensional path is a flexible path. In one embodiment of the invention, the distinguishing character is the "&" character. As will be appreciated by those of ordinary skill in the art, many other characters may be used. For example, the "*" character may be used. All that is required is that the system be able to differentiate between a rigid path and a flexible path.

Concatenate operation 608 concatenates the dimension paths, both rigid and flexible, formed by rigid dimension operation 604, and flexible dimension operation 606, respectively, into a system path for the new cell record. In one embodiment of the invention, the ordering of the dimension paths in the system path is determined by order the dimensions are defined in the cube metadata. However, the invention is not so limited, and in alternative embodiments, the ordering can be determined by temporal order or alphabetic order.

Next, copy operation 610 copies the measure data into an appropriate field in the cell record. The cell record contains a field for each measure present in the cube. The ordering of measures within a record is also determined by the metadata defining the cube.

Record operation 612 then stores the cell record in a data store. In one embodiment of the invention, the cell record is stored as a row of a relational database. The row can be indexed by the system path, allowing subsequent queries requiring the cell's measures to find the cell quickly. As will be appreciated by those of ordinary skill in the art, the cell record may be stored many different ways. For example, the cell record can be stored in the RAM 25 of the computer 20. Decision operation 614 determines if there are any more records to be stored, and if so, returns to receiving operation 602. Otherwise, the system paths created from performing operations 602–612 are compressed (FIG. 7).

Figure 7:
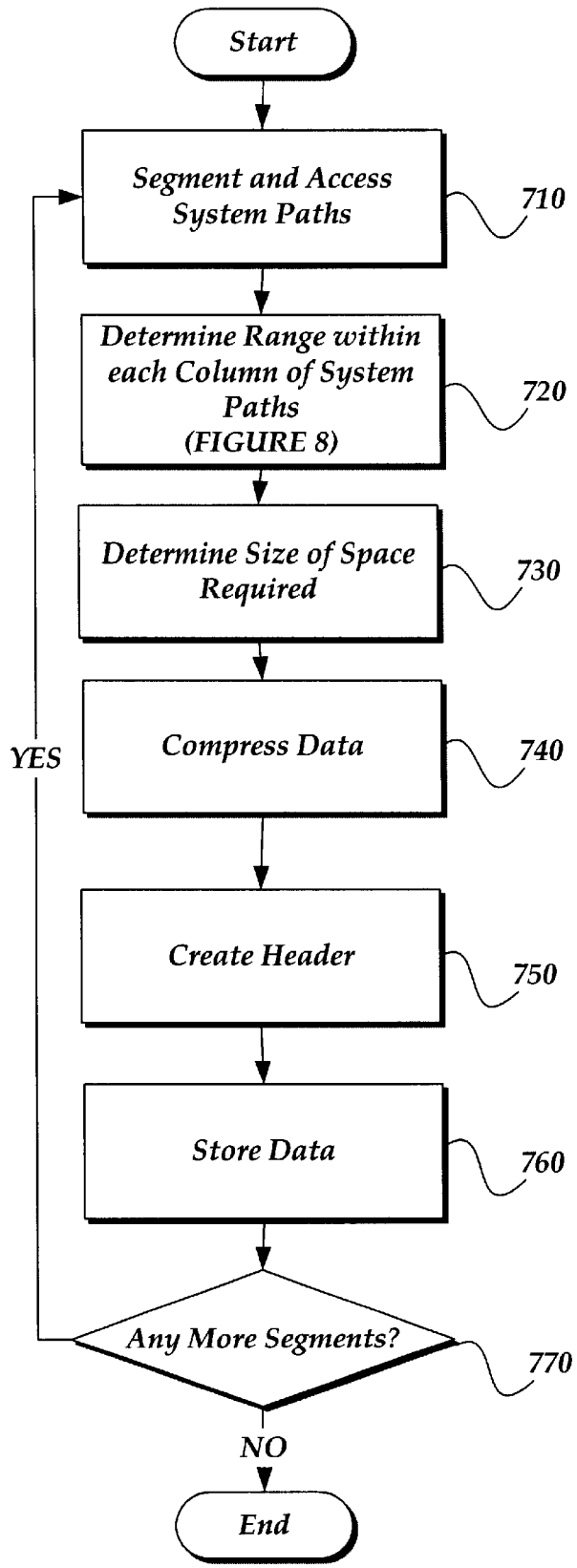
FIG. 7 is a flowchart illustrating determining the range of values within each level of a system path in an embodiment of the invention.

FIG. 7 illustrates an operational flow for compressing the system paths created in FIG. 6. In one embodiment of the invention, segment operation 710 loads the stored system paths from the local data store in 64K segments. As will be appreciated by those of ordinary skill in the art, other segment sizes may be utilized. For example, the segment sizes may be 16K, 32K, or 256K. In another embodiment, the system paths are not loaded in segments. Rather, the system paths are loaded in their entirety. Next, range operation 720 determines the range of values for each level within the system paths (See discussion for FIG. 8). Size operation 730 then determines the size of the space to store the size value within each range index. In one embodiment of the invention, the space to store the size value for the level is the number of bits required to represent the difference between the maximum range value and minimum range value as determined by range operation 820. In another embodiment of the invention, the space to store the size value for the level is the number of bits required to represent the maximum range value as determined range operation 820. For example, in the exemplary cube described above (FIG. 2 and FIGS. 3A–3C), since the State level has three members consisting of Maine, Oregon, and Washington, the index range for this level is 1:3, using two bits of storage. The Cities level index range is 1:1 for Maine and Oregon, and 1:2 for Washington, each using two bits. Finally, in this exemplary example, the Customer level has an index range of 1:4, using three bits to store the levels in binary format. As will be appreciated by those of ordinary skill in the art, other compression methods may be utilized. After the space is determined, the levels for the loaded system paths are compressed by compression operation 740 in the size of the space as determined by size operation 730. In one embodiment of the invention, each level within the system paths of the segment is converted to binary format and stored in the number of bits as determined by size operation 730. Next, header operation 750 creates a header to store the size of the space for each level. In one embodiment of the invention, the size of the space is the number of bits used to store each level of the loaded system paths in binary format. In another embodiment the minimum range value is also stored in the header if the minimum range value is not equal to the maximum range value. This minimum range value is used as an offset value for the values within the level. In one embodiment of the invention, the header is stored in RAM 25 of the computer 20. In another embodiment, the header is stored in the cache 512, local data store 514, fact data store, or OLAP client. This header is then used by the system to determine which bits store a particular level. The compressed paths are then stored in a data store. In one embodiment of the invention, the compressed paths are written to the local data store 514 in 64K segment sizes. In another embodiment, the compressed system paths are stored in the RAM 25 of the computer 20. Decision operation 770 determines if there are any more segments containing system paths, and if so, returns to segment operation 710. If not, the operational flow ends.

Figure 8:
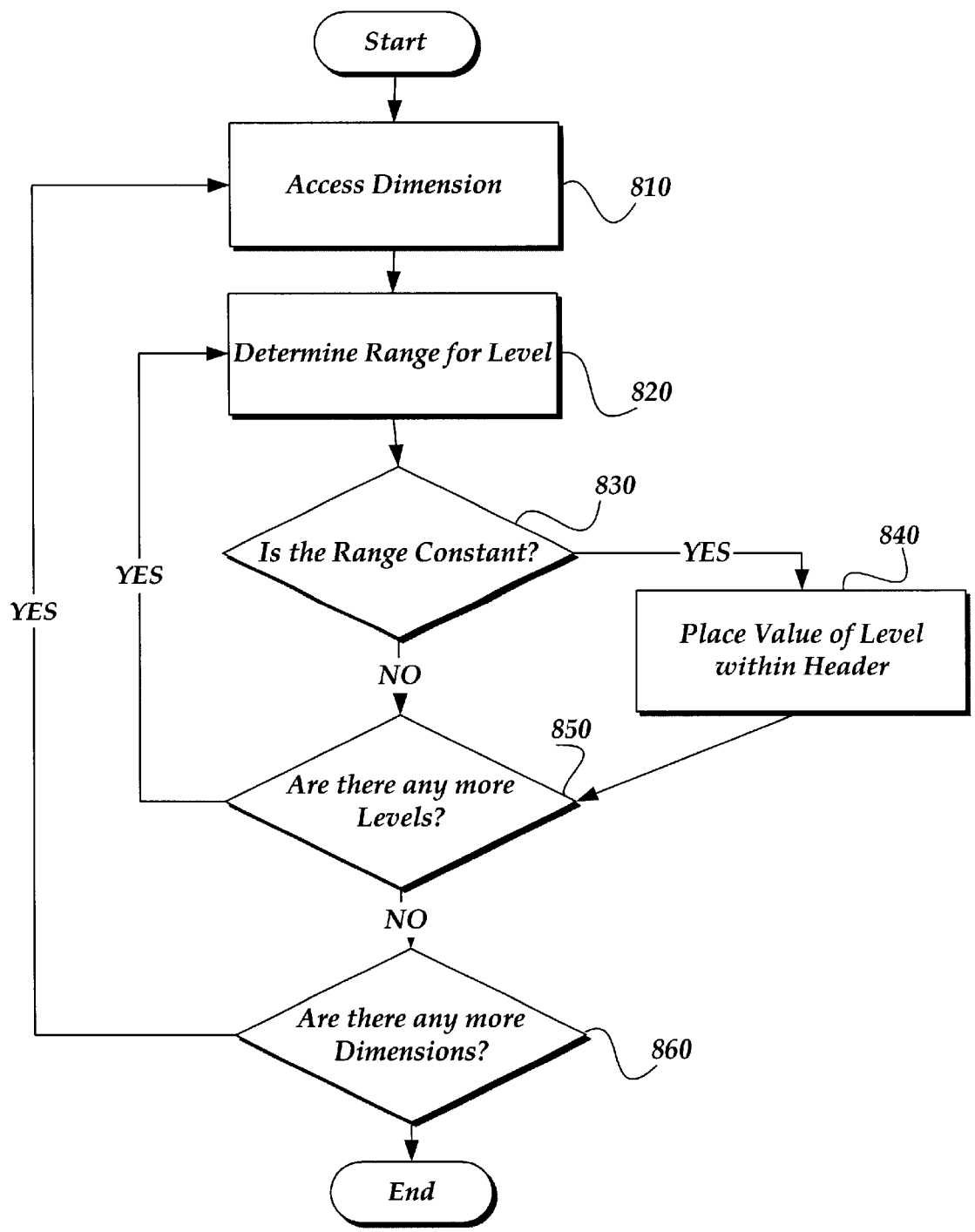
FIG. 8 is a system level overview of various embodiments of the invention.

FIG. 8 illustrates an operation flow for determining the range of values within each level of the system path. Initially, access operation 810 accesses the first dimension within a system path. Next, range operation 820 determines the range of values for each level within the system paths. In one embodiment of the invention, the index range is calculated for each level by determining the minimum and maximum value contained within the level. In another embodiment, the index range is the range of potential values for a particular level contained within the system paths. For example, if the level is States, the index range could be fifty (50), or the index range could be the number of states currently stored within the level. In one embodiment, decision operation 830 determines if the index range is constant, or in other words, if the minimum and maximum value for the level are equal. If the index range is constant then no bits are required to store the values. For example, in the exemplary OLAP cube described above (FIGS. 3A–3C), the All level of the Customers dimension has the constant value 1, as there are no other members at this level. Therefore, since the index range for this level in this particular example is constant, the index value is stored within a header by header operation 840 and no bits are stored for this level, saving additional space. Header operation 840 stores the value of the level within the header when all of the values within the level are the same as each other. By storing the value for the level within the header, space does not need to be allocated within the system path. In another embodiment of the invention, decision operation 830 is not utilized. Next, decision operation 850 determines if there are any more levels within the dimension of which to determine the range, and if so, returns to range operation 820. If there are not any more levels, decision operation 860 determines if there are any more dimensions to the system path. If so, the next dimension is accessed by access operation 810. Otherwise, the operational flow ends.

Figure 9:
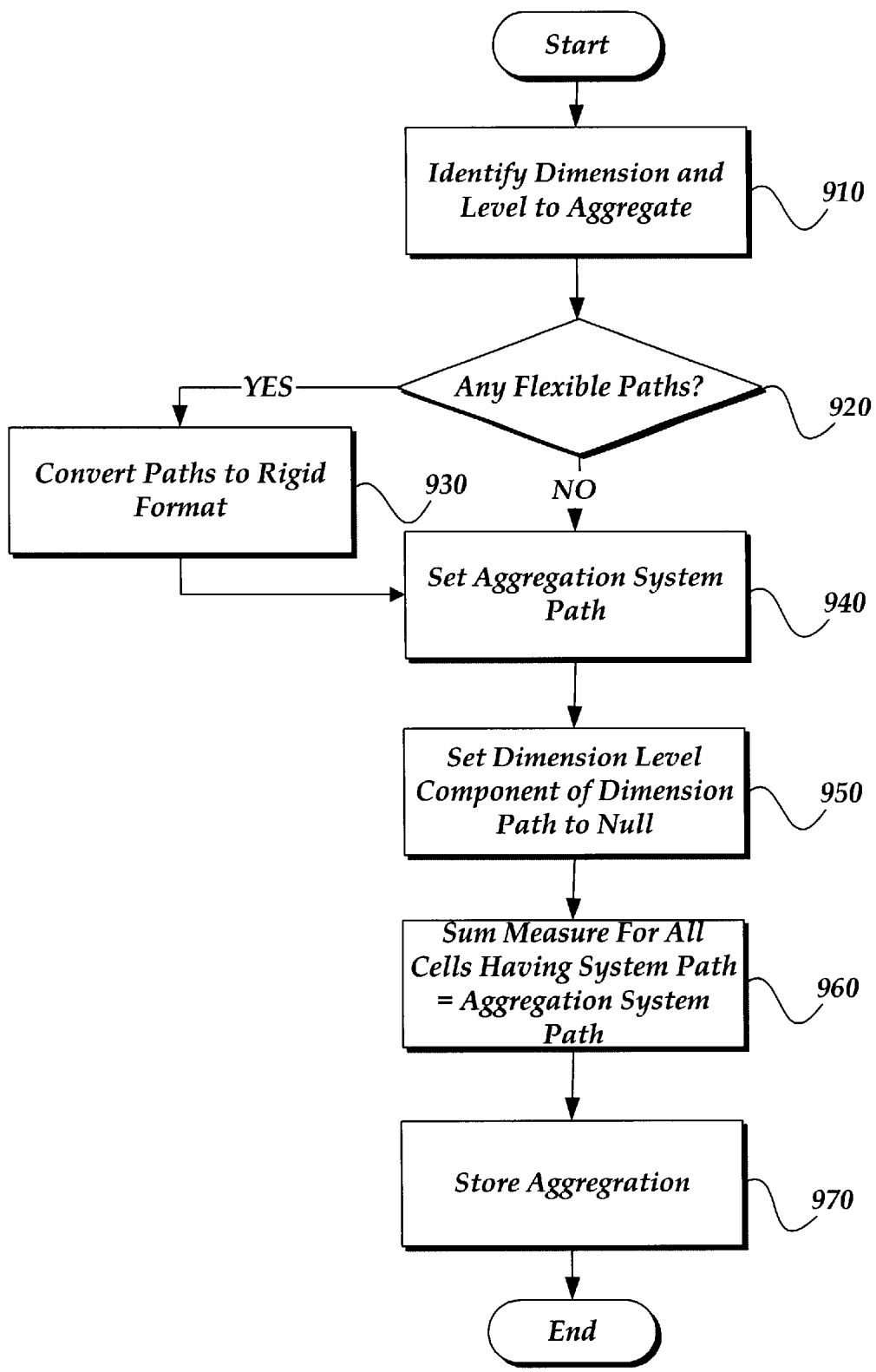
FIG. 9 is a flowchart illustrating a process for calculating an aggregation according to an embodiment of the invention.

FIG. 9 illustrates an operational flow for creating an aggregation of cell data records created using the method described above. Table 3 below provides an exemplary set of data that will be used to demonstrate the results of executing the operations. For clarity of explanation, the compressed paths shown include all levels within the uncompressed system path. As discussed above, in one embodiment of the invention, if the range is constant for a particular level that level's value is stored within the header and not within the system path. Table 3 contains four records. The Member column shows the name of the member in the customer dimension, the System Path column shows the compressed system path corresponding to the cells location in the customer, product and time dimensions, respectively. The third column shows the Product Sales measure for the cell referenced by the system path. The four records represent sales to four customers, Sasha, Alexander, Amir and Mosha for all products in the fourth quarter of 1998.

TABLE 3

| Member | System Path (Rigid Format) (Compressed Format) | Product Sales |
|---|---|---|
| Alexander | {1-48-2-1}-{1-0-0}-{2-4-0} ({1}-{110000}-{10}-{01})- ({1}-{0}-{0})-({10}-{100}- {0}) | $3,000.00 |
| Amir | {1-48-2-2}-{1-0-0}-{2-4-0} ({1}{110000}{10}{10})- ({1}-{0}-{0})-({10}-{100}- {0}) | $2,500.00 |
| Mosha | {1-48-2-3 }-{1-0-0}-{2-4-0} ({1}{110000}{10}{11})- ({1}-{0}-{0})-({10}-{100}- {0}) | $5,000.00 |
| Sasha | {1-20-1-1 }-{1-0-0}-{2-4-0} ({1}{10100}{01}{01})-({1}- {0}-{0})-({10}-{100}-{0}) | $8,000.00 |

A program or logic device executing the operation, such as OLAP server 510, begins by identifying a dimension and level to aggregate as determined by aggregrate operation 910. Typically this will be in response to a request to create an aggregation. The request may come from a system administrator, or it can be a system generated request. As an example, consider a request to aggregate all of the customer sales in Redmond, Wash. in the fourth quarter of 1998.

Next, decision operation 920 determines if any flexible paths are present in the dimension that is to be aggregated. If there are any flexible paths in the dimension to be aggregated, conversion operation 930 converts the flexible path to a rigid path. This is necessary, because the operation requires the ability to manipulate the individual member index in the dimension path that corresponds to the level that is to be aggregated. In the example, Table 3 reflects the fact that the flexible paths were converted to rigid paths in order to perform the aggregation.

Flexible paths that exist in non-aggregated dimensions are left unaltered. This provides the advantage that aggregations can be maintained based on the flexible path. As an example, assume that Amir initially exists in the database as a customer in Redmond. During his stay in Redmond, Amir purchases a number of products, which are aggregated. Amir then moves to Seattle, and continues to purchase more products. By leaving flexible paths in non-aggregated dimensions, the database can produce a single aggregation for Amir that includes products purchased in both Redmond and Seattle. This behavior is typically more desirable then the behavior that occurs with rigid paths. In the rigid path case, two aggregations are created, one for Amir in Redmond, and the other for Amir in Seattle.

In response to the request, set path operation 940 creates a system path for the aggregation record using the dimensions and levels specified in the request. For the example case, the aggregation system path is {1-48-2-0}-{1-0-0}-{2-4-0} in numbered rigid format or ({1}-{110000}-{10}-{00})-({1}-{0}-{0})-({10}-{100}-{0}) in compressed binary format.

Next, null operation 950 scans the local data store containing the cell data records, and "nullifies" (sets to null) the level numbers in the dimension paths for those levels at or below the levels are to be aggregated. Since, in one embodiment of the invention, the levels are represented by bits, multiple levels may be nullified in the same step using the bitwise AND operation. This is accomplished by setting the bits to be nullified to zero in the locations of the particular level to be nullified. For example, in order to nullify level X, represented by bits 5 and 6 in the first byte of the compressed path, the AND operation is applied to the compressed path and byte 0xF3. Similarly, if bits 4–8 are to be nullified the path is ANDed with 0xF0. Table 4 shows the results of nullifying the appropriate level numbers.

TABLE 4

| Member | System Path | Product Sales |
|---|---|---|
| Alexander | {1-48-2-0}-{1-0-0}-{2-4-0} ({1}-{110000}-{10}-{00})-({1}-{0}-{0})-({10}-{100}-{0}) | 3,000.00 |
| Amir | {1-48-2-0}-{1-0-0}-{2-4-0} ({1}{110000}{10}{00})-({1}-{0}-{0})-({10}-{100}-{0}) | 2,500.00 |
| Mosha | {1-48-2-0}-{1-0-0}-{2-4-0} ({1}{110000}{10}{00})-({1}-{0}-{0})-({10}-{100}-{0}) | 55,000.00 |
| Sasha | {1-20-1-0}-{1-0-0}-{2-4-0} ({1}{10100}{01}{00})-({1}-{0}-{0})-({10}-{100}-{0}) | 8,000.00 |

Next, sum operation 960 sums the desired measure for all cell records where the system path of the cell record matches the system path of the aggregation record. In the example shown above, the aggregation record is:

{1-48-2-0}-{1-0-0}-{-2-4-0} {$10500.00} in numbered format or ({1}{110000}{10}{00})-({1}-{0}-{0})-({10}-{100}-{0}) ({$10500.00}) in compressed format. This aggregation reflects the fact that system paths for Customer members Alexander, Amir and Mosha matched the aggregation system path.

Finally, store operation 970 stores the aggregation record in a data store. In one embodiment of the invention, the aggregation record is stored in a cache maintained by the OLAP server. This is desirable, because it allows the aggregation record to be located quickly, thereby increasing system throughput.

In one embodiment of the invention, the nullification of dimension path elements is accomplished using temporary buffers. The source records are kept in their original, unconverted state and the nullification and summation operations described above are performed on copies of the source records maintained in the temporary buffers. This has the advantage that there is no need to restore values in the source records after the aggregation has been performed, the system need only delete the temporary buffers.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. For example, those of ordinary skill within the art will appreciate that while the systems, methods, and articles have been described in the context of a multidimensional database system, the systems, methods, and articles of the invention can be applied to other data that is hierarchical in nature. The terminology used in this application with respect creating and maintaining cell records is meant to include all of these environments. Therefore, it is manifestly intended that this invention be limited only by the following claims and equivalents thereof.

We claim:

1. A method for compressing a plurality of system paths that correspond to a plurality of cell records in a database, the method comprising:

accessing a plurality of system paths, each system path having at least one dimension, that includes at least one level and at least one member;

determining a size of a space to store each level of the plurality of the system paths in a compressed format;

storing the size of each determined space in a header;

compressing each level of the plurality of the system paths in accordance with each determined size to create a plurality of compressed system paths; and storing the plurality of compressed system paths in a data store.

2. The method of claim 1, wherein accessing the plurality of system paths, comprises organizing the plurality of system paths into at least one segment.

3. The method of claim 1, wherein determining the size of the space to store each level of the plurality of the system paths in a compressed format, comprises:

determining a minimum value for each level of the plurality of the system paths;

determining a maximum value for each level of the plurality of the system paths; and determining the size of the space to store each level based on the minimum value and the maximum value.

4. The method of claim 3, wherein determining the size of the space to store each level based on the minimum value and the maximum value, further comprises:

determining when the maximum value and the minimum value are equal, and if so:
      setting the size of the space to zero; and
      storing the maximum value in the header; and else:
         calculating a difference between the maximum value and minimum value; and
         setting the size of the space based on the difference.

5. The method of claim 4, wherein setting the size of the space based on the difference, comprises:

calculating a number of bits required to store the difference in binary format; and setting the size of the space to the calculated number of bits.

6. The method of claim 5, wherein compressing each of the plurality of system paths, comprises converting each level of the plurality of system paths into a binary format.

7. A method for determining an aggregation measure, comprising:

identifying an aggregation measure and an aggregation system path, the aggregation system path specifying an aggregation dimension and an aggregation level;

converting any flexible dimension paths that exist in the aggregation dimension to rigid dimension paths;

for each record of a plurality of records, each record having a compressed system path having a plurality of level components, performing actions, including:
  setting a level component corresponding to the aggregation level to a null value, and
  setting each level component corresponding to a level below the aggregation level to the null value;
  selecting a subset of the plurality of records where the system path equals the aggregation system path; and
  summing a measure corresponding to the aggregation measure in each record of the subset to create an aggregated measure.

8. A system comprising:
a processor and a computer-readable medium;
an operating environment executing on the processor from the computer-readable medium;
a map table;
a fact data store;
a local data store; and
an OLAP server executing under the control of the operating environment and operative to perform actions, including:
  loading a plurality of system paths, each system path having at least one dimension, that includes at least one level and at least one member;
  calculating a size of a space to store each level in a compressed format;
  storing each size of each determined space in a header;
  compressing each level of the plurality of the system paths in accordance with each of the determined spaces to create a plurality of compressed system paths; and
  storing the plurality of compressed system paths in a data store.

9. The system of claim 8, wherein loading the plurality of system paths, comprises:
  organizing the plurality of system paths into at least one segment; and
  loading the at least one segment into the operating environment executing on the processor.

10. The system of claim 9, wherein determining the size of the space to store each level in a compressed format, comprises:
  calculating a value for each member within each level of the system paths;
  calculating the size of each space based on each calculated value.

11. The system of claim 10, wherein calculating the size of the space based on each calculated value, further comprises:
  determining when all of the calculated values are equal to each other; and if so:
    setting the size of the space to zero; and
    storing one of the calculated values in the header; else:
      calculating a maximum value and a minimum value for all of the calculated values; and
      calculating a difference based on the maximum value and minimum value; and
      calculating the size of the space based on the difference.

12. A system configured for determining an aggregation measure, comprising:
a processor and a computer-readable medium;
an operating environment executing on the processor from the computer-readable medium;
a map table;
a fact data store;
a local data store; and
an OLAP server executing under the control of the operating environment and operative to perform actions, including:
  identifying an aggregation measure and an aggregation system path, the aggregation system path specifying an aggregation dimension and an aggregation level;
  for each record of a plurality of records, each record having a compressed system path having a plurality of level components, performing actions, comprising:
    setting a level component corresponding to the aggregation level to a null value,
    setting each level component corresponding to a level below the aggregation level to the null value;
    selecting a subset of the plurality of records where the system path equals the aggregation system path; and
    summing a measure corresponding to the aggregation measure in each record of the subset to create an aggregated measure.

13. A computer-readable medium readable by a computing system and having computer instructions for executing a computer process for compressing a set of system paths, the computer process comprising:
  accessing a segmented set of system paths, each system path having at least one dimension, that includes at least one level and at least one member;
  determining a size of a space to store each level of the set of system paths in a compressed format;
  storing each size of each determined space in a header;
  compressing each level of the set of system paths in accordance with each determined size to create a set of compressed system paths; and
  storing the set of compressed system paths in a data store.

14. The computer-readable medium of claim 13, wherein the act of determining the size of each space to store each level in a compressed format, comprises:
  determining a value for each member within each level of the set of system paths; and
  determining the space to store each level based on each determined value for each member.

15. The computer-readable medium of claim 14, wherein the act of determining the size of the space to store each level comprises:
  calculating a maximum value and minimum value from each determined value for each member, and
  calculating a difference between the maximum value and the minimum value; and
  calculating a minimum number of bits to store the difference.

16. The computer-readable medium of claim 15, further comprising:
  determining when the minimum value and the maximum value are equal; and if so
    setting the space to zero, and
    storing the minimum value in the header.

17. Apparatus for compressing a plurality of system paths used for accessing cell records in a database, said apparatus comprising:
  a load module loading a plurality of system paths from a data store, the plurality of system paths having at least one dimension, that includes at least one level and at least one member;

size module calculating a size of a space to store each level of the plurality of the system paths in a compressed format;

storage module storing each calculated size of each space in a header;

compression module compressing each level of the plurality of the system paths in accordance with each determined size to create a plurality of compressed system paths; and a data store storing the plurality of compressed system paths.

18. The apparatus of claim 17, wherein the load module comprises:

an organizational module for organizing the plurality of system paths into at least one segment.

19. The apparatus of claim 17, wherein the size module, comprises:

a min/max module for determining a minimum value and a maximum value for each level of the plurality of system paths; and a set module setting the size of the space to zero if the minimum value equals the maximum value and setting the size of the space based on the maximum value and minimum value if the minimum value is not equal to the maximum value.

20. The apparatus of claim 19, wherein said set module setting the size of the space based on the maximum value and minimum value, if the minimum value is not equal to the maximum value, sets the size of the space to the number of bits used to represent the maximum value less the minimum value in binary format.

21. The apparatus of claim 20, wherein said compression module converts each level of the plurality of the system paths to binary format.

* * * * *